United States Patent [19]
Hirokawa et al.

[11] Patent Number: 5,134,640
[45] Date of Patent: Jul. 28, 1992

[54] SYNCHROTRON RADIATION APPARATUS

[75] Inventors: Toshio Hirokawa, Kawasaki; Norio Uchida; Osamu Kuwabara, both of Yokohama; Nobutaka Kikuiri, Tokyo, all of Japan

[73] Assignee: Kabushiki Kaisha Toshiba, Kawasaki, Japan

[21] Appl. No.: 707,780

[22] Filed: May 30, 1991

[30] Foreign Application Priority Data

May 31, 1990 [JP] Japan .................. 2-139571

[51] Int. Cl.$^5$ .............................................. G21K 5/00
[52] U.S. Cl. ................................... 378/34; 378/161
[58] Field of Search ........................... 378/34, 161

[56] References Cited
U.S. PATENT DOCUMENTS 4,748,646 5/1988 Osada et al. .................. 378/34

OTHER PUBLICATIONS

J. Vac. Sci. Technol. B1 (4), Oct.–Dec. 1983, "Design and Performance of an X-ray Lithography Beam Line at a Storage Ring", R. P. Haelbich et al.

Primary Examiner—Craig E. Church
Attorney, Agent, or Firm—Oblon, Spivak, McClelland, Maier & Neustadt

[57] ABSTRACT

An X-ray radiation apparatus comprises a synchrotron 11 that generates X rays, an X-ray reflecting mirror 13 that reflects X rays emitted from the synchrotron 11, a mirror driving mechanism that enlarges the X-ray illumination area by oscillating the mirror 13, a beryllium window 14 that is connected to the synchrotron-side housing base containing the mirror 13 by means of a bellows 17 and that allows the X rays reflected by the mirror 13 to be taken out of the vacuum environment, and a window driving mechanism 18 that moves the window 14 along with the movement of the X-ray illumination position by oscillating the window 14 in synchronization with the oscillation of the mirror 13. With this arrangement, the X rays coming from the window 14 pass through the X-ray mask 15 and fall upon the specimen 16 to replicate the mask pattern into the specimen.

18 Claims, 6 Drawing Sheets

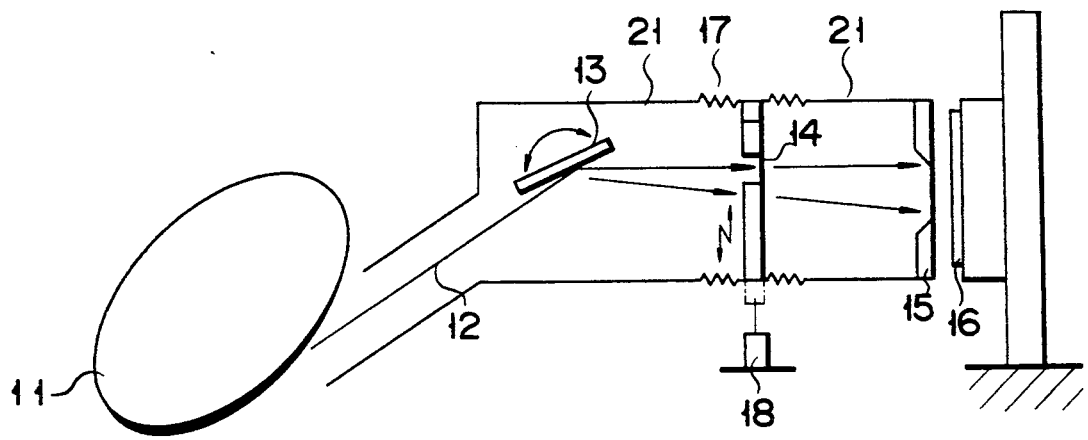
F I G. 1A
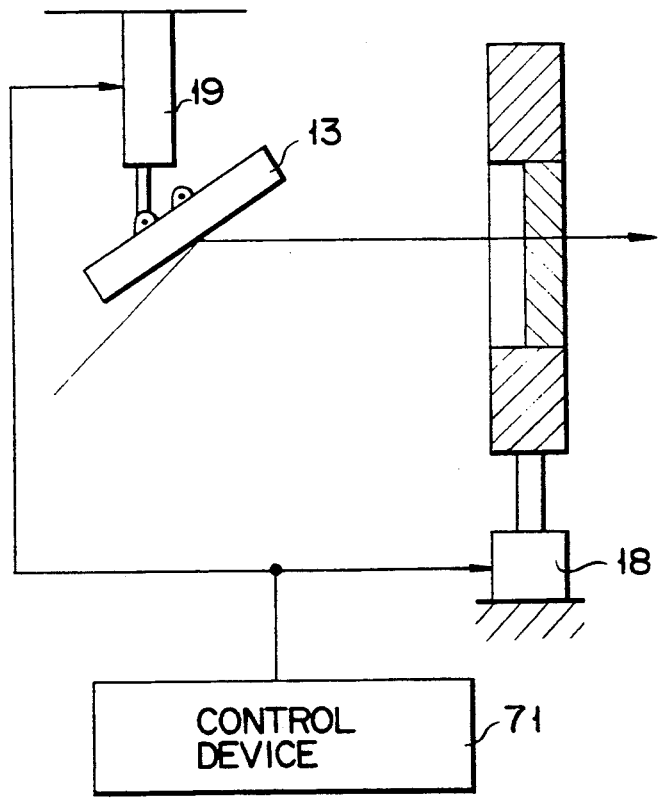
F I G. 1B

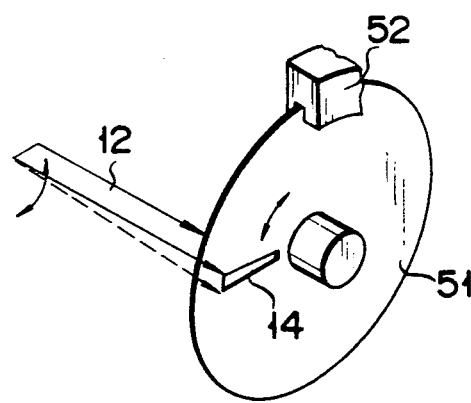
F I G. 9A
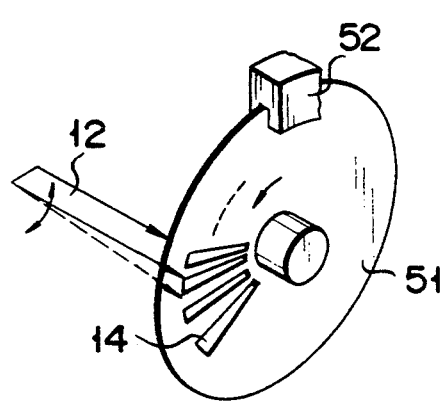
F I G. 9B
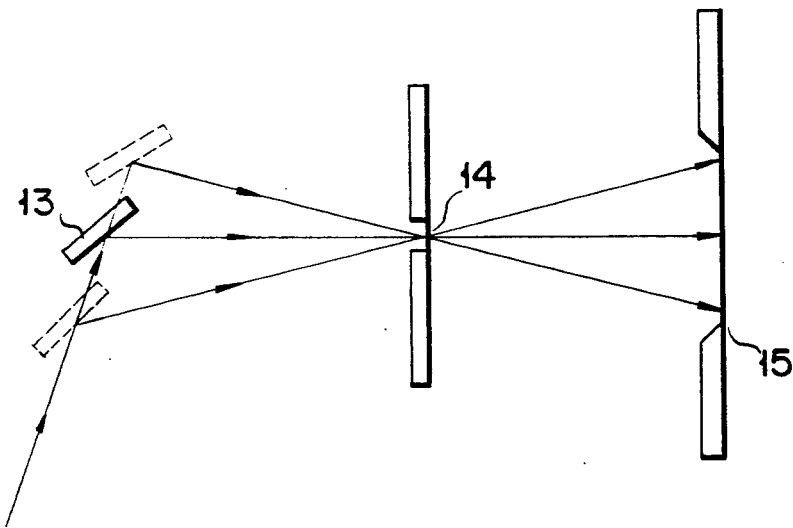
F I G. 10

SYNCHROTRON RADIATION APPARATUS

BACKGROUND OF THE INVENTION

1. Field of the Invention

This invention relates to a synchrotron radiation technique using a synchrotron or SOR (Synchrotron Orbital Radiation), and more particularly to a synchrotron radiation apparatus that enlarges radiation area by oscillating the radiation reflecting mirror.

2. Description of the Related Art

Up to now, it has been common practice to use photolithography apparatus to form LSI patterns. As LSI patterns are getting much smaller, however, photolithography apparatus are becoming less suitable for producing such finer LSI patterns. To cope with this situation, X-ray lithography apparatus have recently been developed which can produce even finer patterns. They require an X-ray source of high intensity and as such a source, SOR is now attracting attention.

In a conventional X-ray lithography apparatus using SOR as the X-ray source, an SOR-caused X-ray beam reflects at the X-ray reflecting mirror, passes through the X-ray beam window, and meets the X-ray mask. The X-rays passing through the X-ray mask fall upon the wafer to replicate the mask pattern into the wafer. Here, the spot size of the X-ray beam from SOR is, for example, a rectangle of approximately 5 mm×25 mm. To use this X-ray beam as lithography light in semiconductor manufacturing apparatus, it is necessary to enlarge the X-ray illumination area to a square of approximately 25 mm×25 mm equal to the exposure area. Such enlargement of the X-ray illumination area is achieved by oscillating the mirror.

However, this type of apparatus has the following problem: That is, the X-ray beam window, which separates the SO beam line from the exposure chamber (the ordinary working area), is generally made up of beryllium thin film. To strengthen the X-ray beam window which has the size 25 mm×25 mm or more large enough to cover the exposure area, so that the window can withstand the pressure difference between the high vacuum beam line and the chamber of atmospheric pressure or low vacuum, it is necessary to thicken the beryllium thin film. Since beryllium has not a very large X-ray transmittance, thicker beryllium film involves larger attenuations in X rays, which makes the exposure time longer, thus decreasing the overall throughput.

As noted above, in SOR-based X-ray radiation techniques, the enlargement of the X-ray illumination area is achieved by oscillating the X-ray reflecting mirror. However, making the X-ray beam window size larger to assure an enough exposure area requires the beryllium thin film to be thicker, resulting in a larger X-ray attenuation. Further, in X-ray lithography apparatus, such larger X-ray attenuation lowers the overall throughput.

SUMMARY OF THE INVENTION

An object of the present invention is to provide a synchrotron radiation apparatus that ensures a sufficient illumination area without enlarging the radiation beam window size and reduces an attenuation in the radiation at the radiation beam window.

Another object of the present invention is to provide a synchrotron lithography apparatus that ensures a sufficient illumination area without enlarging the radiation beam window size and that reduces an attenuation in the radiation at the radiation beam window to improve the throughput.

The gist of this invention is to secure a sufficient radiation area without enlarging the radiation beam window size by moving the window along with the movement of the radiation beam instead of making the radiation beam window larger.

According to the present invention, it is possible to provide an X-ray radiation apparatus comprising: an radiation reflecting mirror for reflecting a radiation radiated from a synchrotron; a mirror driver for moving the X-ray reflecting mirror to enlarge an illumination area; a radiation beam window for allowing the X rays reflected by the radiation reflecting mirror to be taken out of the vacuum environment; and a window driver, which connects the radiation beam window, via a flexible structure to the synchrotron-side base housing the radiation reflecting mirror, and which moves the X-ray beam window along with the movement of the illumination position, in synchronism with the movement of the radiation reflecting mirror; wherein the radiation taken out of the radiation beam window are radiated onto an object attached to the synchrotron-side base.

According to the present invention, it is also possible to provide an X-ray lithography apparatus comprising: an X-ray reflecting mirror for reflecting X rays radiated from the synchrotron; a mirror driving mechanism for moving the X-ray reflecting mirror to enlarge the X-ray illumination area; an X-ray beam window, which is connected, via a flexible structure, to the synchrotron-side base housing the X-ray reflecting mirror, and which allows the X rays reflected by the X-ray reflecting mirror to be taken out of the vacuum environment; and a window driving mechanism for moving the X-ray beam window in synchronism with the movement of the X-ray reflecting mirror; wherein the X rays taken out of the X-ray beam window are radiated onto the X-ray mask attached to the synchrotron-side base so that the X rays passing through the mask may fall upon the specimen to replicate the mask pattern into the specimen.

With this invention, it is possible to move the radiation beam window along with the movement of the radiation beam by vibrating the radiation beam window in synchronism with the movement of the radiation reflecting mirror. Therefore, the radiation beam from the radiation reflecting mirror can be constantly taken out of the radiation beam window, with the result that the radiation beam is obtained over the wide area (the entire exposure area), just as the radiation beam window is made as large as the illumination area.

The X-ray transmittance for beryllium thin films is exponentially reduced with respect to the film thickness. A beryllium thin film window covering the exposure area of 25 mm×25 mm (36 mm in diameter) needs approximately 30 μm of thickness to withstand atmospheric pressure. For such thickness, the X-ray transmittance is said to be nearly 20%, meaning a considerably adverse effect on the throughput, even in the case of high energy X rays. On the other hand, for a beryllium thin film window being the same shape of 5 mm×25 mm as that of the SOR radiation, the thickness required to withstand atmospheric pressure is approximately 20 μm, which allows the transmittance to increase 30% to 40%. As a result, it is possible to reduce an attenuation in X rays at the X-ray beam window by making the size of the X-ray beam window nearly as large as the X-ray beam and then moving the window together with the movement of the X-ray beam. This shortens the exposure time, promising a large improvement in the throughput. Further, the smaller beryllium thin film size facilitates manufacturing, thus leading to a reduction in production costs.

The X-ray transmittance for the atmosphere or a helium atmosphere cannot be neglected either. In an atmosphere of helium, the X-ray transmittance is improved from 60% at a distance of 50 cm to 80% at a distance of 25 cm. Thus, for a shorter exposure time, it is desirable to shorten the distance between the X-ray beam window and the X-ray mask (the object). In this case, if the oscillation of the X-ray beam window reaches the mask side, this has an adverse effect on the mask-to-wafer alignment and creates exposure blurring. However, this problem can be avoided by connecting the X-ray beam window to the synchrotron-side base via a flexible structure, and at the same time, attaching the X-ray mask to the synchrotron-side base independently from the window.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a schematic diagram for a synchrotron radiation apparatus according to a first embodiment of the present invention;

FIG. 1B is a diagrammatic view of a driving mechanism for the reflecting mirror and X-ray beam window;

FIGS. 9A and 9B are perspective views for the important portions of synchrotron radiation apparatus according to modifications of the present invention; and FIG. 10 is a sectional view for the important portions of a synchrotron radiation apparatus according to another modification of the present invention.

DETAILED DESCRIPTION OF THE PREFERRED EMBODIMENTS

Figure 2:
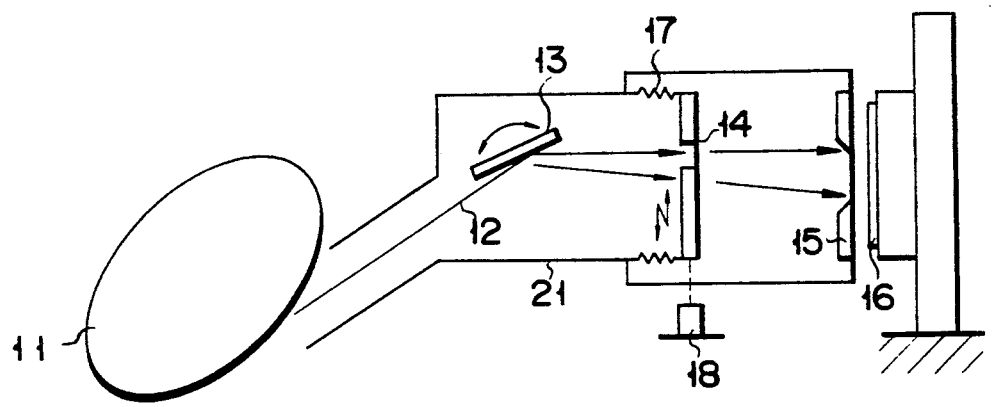
FIG. 2 is a schematic diagram for an X-ray radiation apparatus according to a second embodiment of the present invention.

A synchrotron radiation apparatus schematically shown in FIG. 1A is constructed as an X-ray lithography apparatus. In the X-ray lithography whose X-ray source is composed of a synchrotron (SOR) 11, an X-ray beam 12 coming from the SOR 11 reflects at an X-ray reflecting mirror 13, passes through an X-ray beam window 14, and enters the ordinary working area through the high vacuum beam line formed within a housing on the side of a mask 15. The X-ray beam 12 passes an X-ray mask 15 and meets a wafer 16 on which X-ray resist has been applied.

The X-ray reflecting mirror 13 is coupled with a mirror driver 19 as shown in FIG. 1B, which comprises, for example, a piezoelectric element or motor a cylinder and so on, and which is vertically moved or vertically reciprocated by the driver 1 to enlarge the X-ray illumination area. The X-ray beam window 14 is connected to a housing base 21 with a bellows 17 of a flexible structure, between the mirror 13 side and the X-ray mask 15 side. With this arrangement, the X-ray beam window 14 is vibrated, by a window driver 18 comprising, for example, a piezoelectric element or motor, a cylinder and so on, in the arrow direction in synchronization with the movement of the X-ray reflecting mirror 13, as shown in FIG. 1A. The mirror driver 19 and X-ray window driver 18 are controlled by a drive control device 71 (see FIG. 8) so as to synchronize with each other.

While in the embodiment of FIG. 1A, the X-ray beam window 14 is attached to the housing base 21, by means of the bellows 17, between the mirror 13 side and the X-ray mask 15 side, it may be coupled with the housing base 21 only on the mirror side, by means of the bellows 17 so as to allow oscillation as shown in FIG. 2. With this configuration, the major portions of an X-ray lithography apparatus are explained, referring to FIG. 3.

The X-ray beam 12, which has been emitted from the SOR 11 and reflected at the X-ray reflecting mirror 13, enters from the left side of the figure. To the SOR housing base 21 on the left side, the X-ray beam window 14 is attached with the flexible bellows 17 so as to allow reciprocation. The inside 22 of the housing base 21 on the SOR side is kept in a high vacuum, while the inside 24 of the chamber 23 on the mask side is in a substantial atmospheric pressure or a depressurized environment of helium.

The X-ray beam window 14 is made up of a beryllium thin film reinforced with a rectangular ring or the like around its hem. It is called a beryllium window. The beryllium window 14 is connected to a drive shaft 25. The drive shaft 25 is supported by a bearing 26 so as to allow up-and-down movements in a helium environment within the chamber 23, and is moved up and down by the window driver 18 located outside the chamber 23. In this embodiment, the shape of the X-ray beam 12 from the SOR 11 is a rectangle of 5 mm × 25 mm and the X-ray beam window 14 is also shaped into a rectangle almost as large as the X-ray beam 12.

The beryllium window may be a circular beryllium window of a diameter of 36 mm for example, if the illumination area is larger. The circular window has a merit that it can be made easier than the rectangular window.

Figure 4:
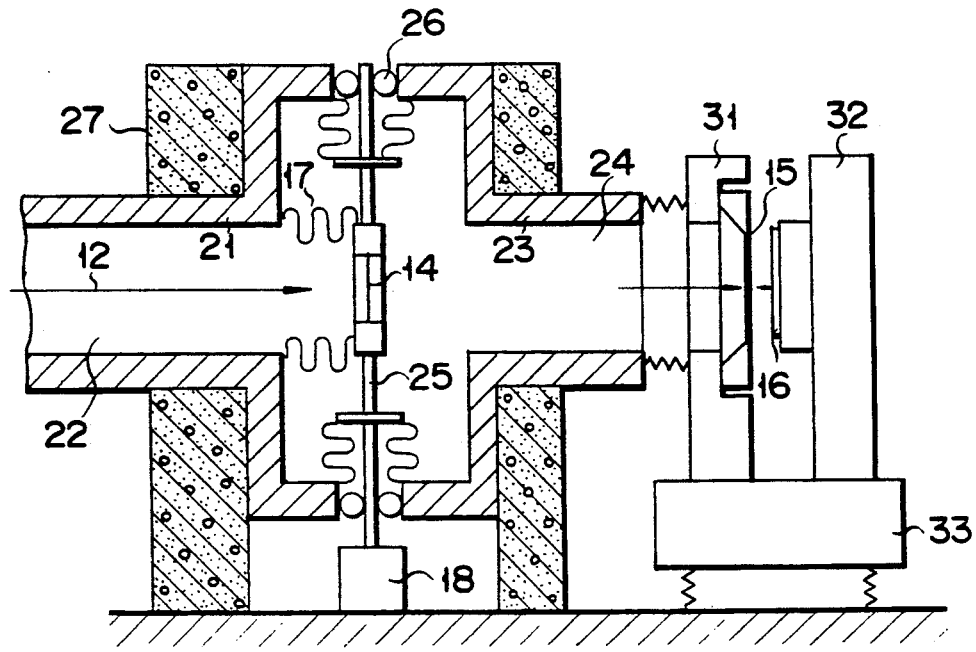
FIG. 4 is a sectional view for the main portions of a synchrotron radiation apparatus according to a third embodiment of the present invention.

Connected to the chamber 23 is a mask holding fixture 31, to which the X-ray mask 15 is attached. To the right of the mask 15, the wafer 16 secured to a wafer stage 32 is placed so that the mask and wafer face each other. In FIG. 4, a supporting structure 27 made of, for example, concrete, supports the base 21 and chamber 23 in a fixed manner, while a vibration isolator 33 has the mask holding fixture 31 and wafer stage 32 placed on it.

With this construction, the X-ray beam 12 emitted from the SOR 11 is reflected by the X-ray reflecting mirror 13, and at the same time, deflected up and down in the figure, by the vibration of the mirror 13. Although the beryllium window 14 is nearly as large as the X-ray beam 12, the window is vertically vibrated in synchronism with the movement of the mirror 13, so that the X-ray beam 12 is not blocked at portions other than the beryllium window 14 thus ensuring that the entire beam always passes through the window. The X-ray beam 12 passing through the beryllium window 14 is radiated onto the X-ray mask 15, with the result that the X-rays corresponding to the pattern of the X-ray mask 15 are illuminated onto the wafer 16, on which X-ray resist has been applied. As a result of the exposure, the mask pattern is replicated into the resist.

In this embodiment, since the beryllium window 14 is vertically vibrated in synchronization with the movement of the X-ray reflecting mirror 13, the X-ray beam 12 deflected up and down will constantly pass through the window 14 without being blocked by the window frame, even if the size of the beryllium window 14 is nearly the same as that of the X-ray beam 12. This assures the exposure area several times as large as the size of the beryllium window 14. Since there is no need to make the size of the beryllium window 14 larger, the beryllium thin film in the beryllium window 14 can be made thinner, thereby increasing the X-ray transmittance. This makes it possible to shorten the exposure time, thus improving the exposure throughput.

The smaller beryllium window size makes it easier to form a uniform beryllium thin film, preventing non-uniform exposure from taking place. In addition, since the beryllium window 14 is coupled with the base 21 on the SOR side with the bellows 17, this prevents the oscillation of the beryllium window 14 from reaching the mask 15, wafer 16, and others. As a result, the distance from the beryllium window 14 to the mask 15 can be shortened, thus reducing an attenuation in the X rays in an atmosphere of helium.

Figure 3:
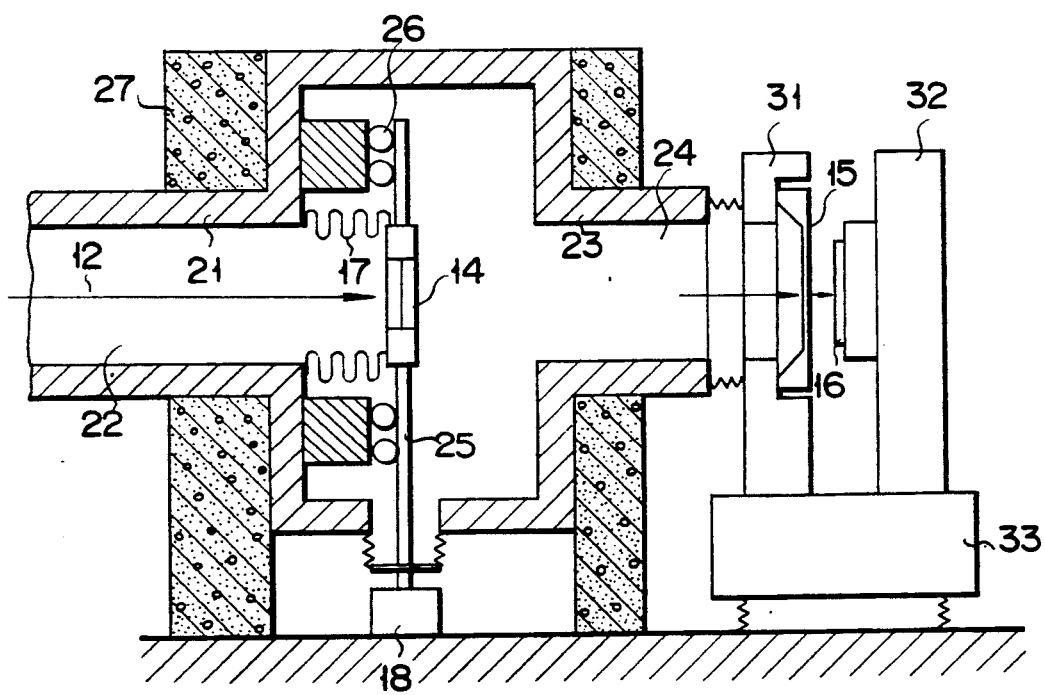
FIG. 3 is a sectional enlarged view for the major portion of the synchrotron radiation apparatus according to the second embodiment.

Referring to FIG. 4, the major portions of a third embodiment will be described. The same parts as those in FIG. 3 are indicated by the same reference characters and their detailed explanation will be omitted.

This embodiment differs from the second embodiment described above in that the bearing 26 supporting the beryllium window 14 is positioned outside the ordinary working area. That is, the drive shaft 25 for the beryllium window 14 is extended out of the chamber 23 and supported by the bearing 26 in the atmosphere. This arrangement also provides similar results to those with the second embodiment.

Figure 5:
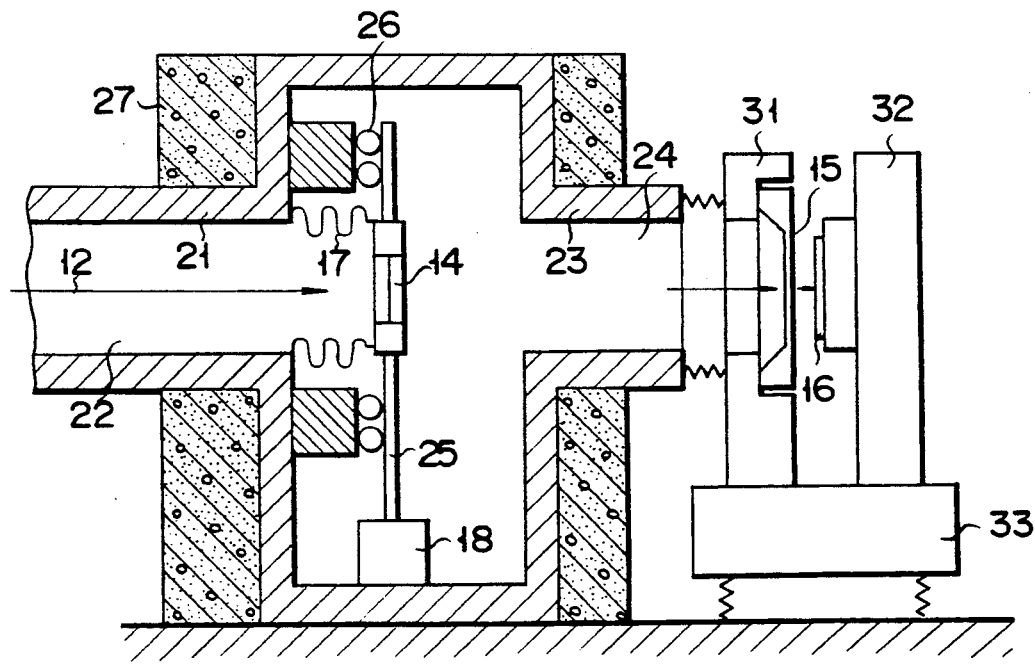
FIG. 5 is a sectional view for the chief portions of a synchrotron radiation apparatus according to a fourth embodiment of the present invention.

Referring to FIG. 5, the primary portions of a fourth embodiment will be described. The same parts as those in FIG. 3 are indicated by the same reference characters and their detailed explanation will be omitted.

This embodiment is different from the second and third embodiments in that both window driving mechanism 18 and bearing 26 are housed in an environment of helium 24. This configuration makes it unnecessary to seal the drive shaft 25, simplifying the construction without the sacrifice of similar results as those with the second and third embodiments.

Figure 6:
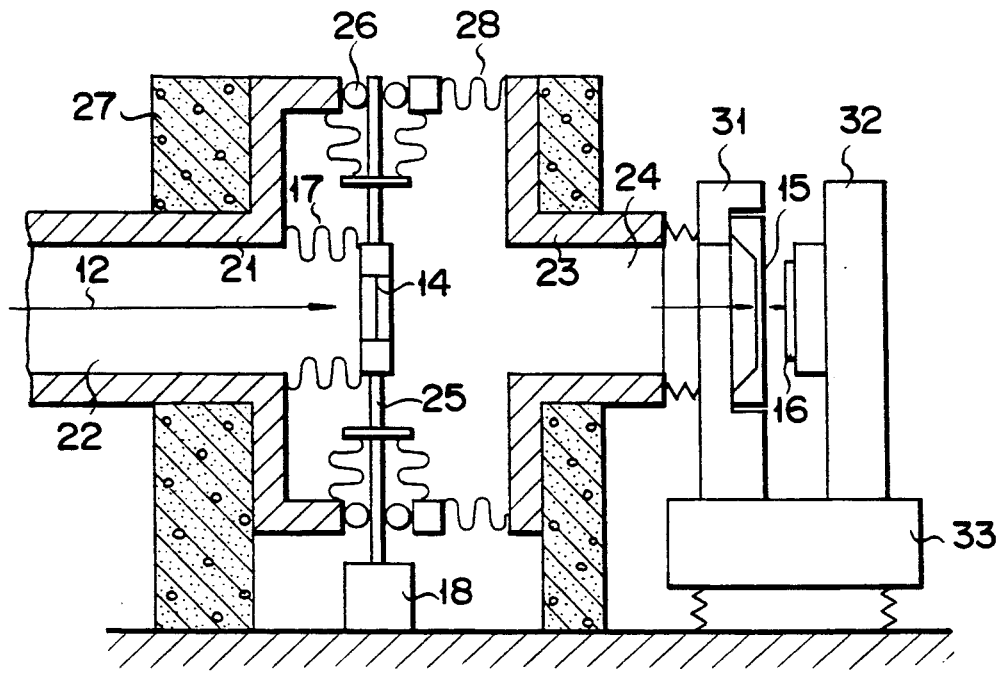
FIG. 6 is a sectional view for the primary portions of a synchrotron radiation apparatus according to a fifth embodiment of the present invention.

Referring to FIG. 6, the chief portions of a fifth embodiment will be described. The same parts as those in FIG. 3 are indicated by the same reference characters and their detailed explanation will be omitted.

The difference between this embodiment and the third embodiment is that a bellows 28 acting as a flexible structure is installed between the SOR-side beam line and the ordinary working area. The connection of the beam line with the working area via the bellows 28 prevents the reciprocation of the beryllium window 14 more reliably from reaching the mask side.

Figure 7:
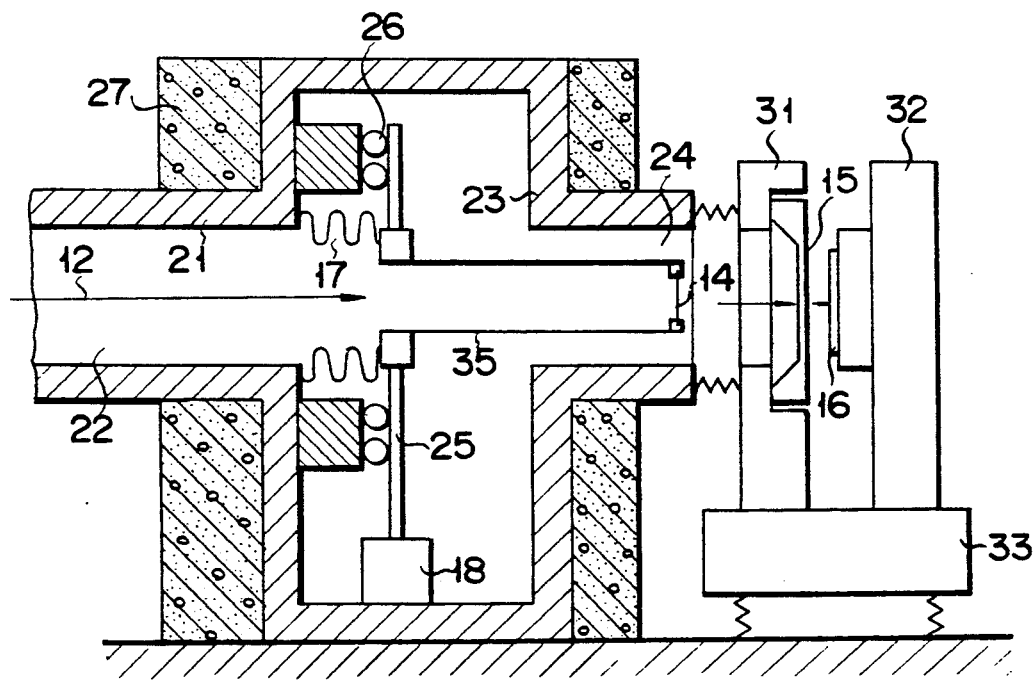
FIG. 7 is a sectional view for the important portions of a synchrotron radiation apparatus according to a sixth embodiment of the present invention.

Referring to FIG. 7, the important portions of a sixth embodiment will be described. The same parts as those in FIG. 3 are indicated by the same reference characters and their detailed explanation will be omitted. In this embodiment, to minimize an attenuation in the X rays, the beryllium window 14 is positioned close to the X-ray mask 15.

Placing the beryllium window 14 as well as the window driver 18 and bearing 26 near the X-ray mask 15 is impossible in terms of available space. To shut out the reciprocation, it is desirable not to put the window driver 18 and bearing 26 closer to the X-ray mask. In considering an attenuation in the X rays, however, the distance through which the X rays pass should be as short as possible. Thus, viewed in this light, it is desirable to position the beryllium window 14 closer to the X-ray mask 15. For this reason, in this embodiment, the drive shaft 25 is attached to an end of an extension tube 35, the other end of which is connected to the beryllium window 14. This construction can not only decrease an attenuation in the X rays, but cut out oscillation.

Figure 8:
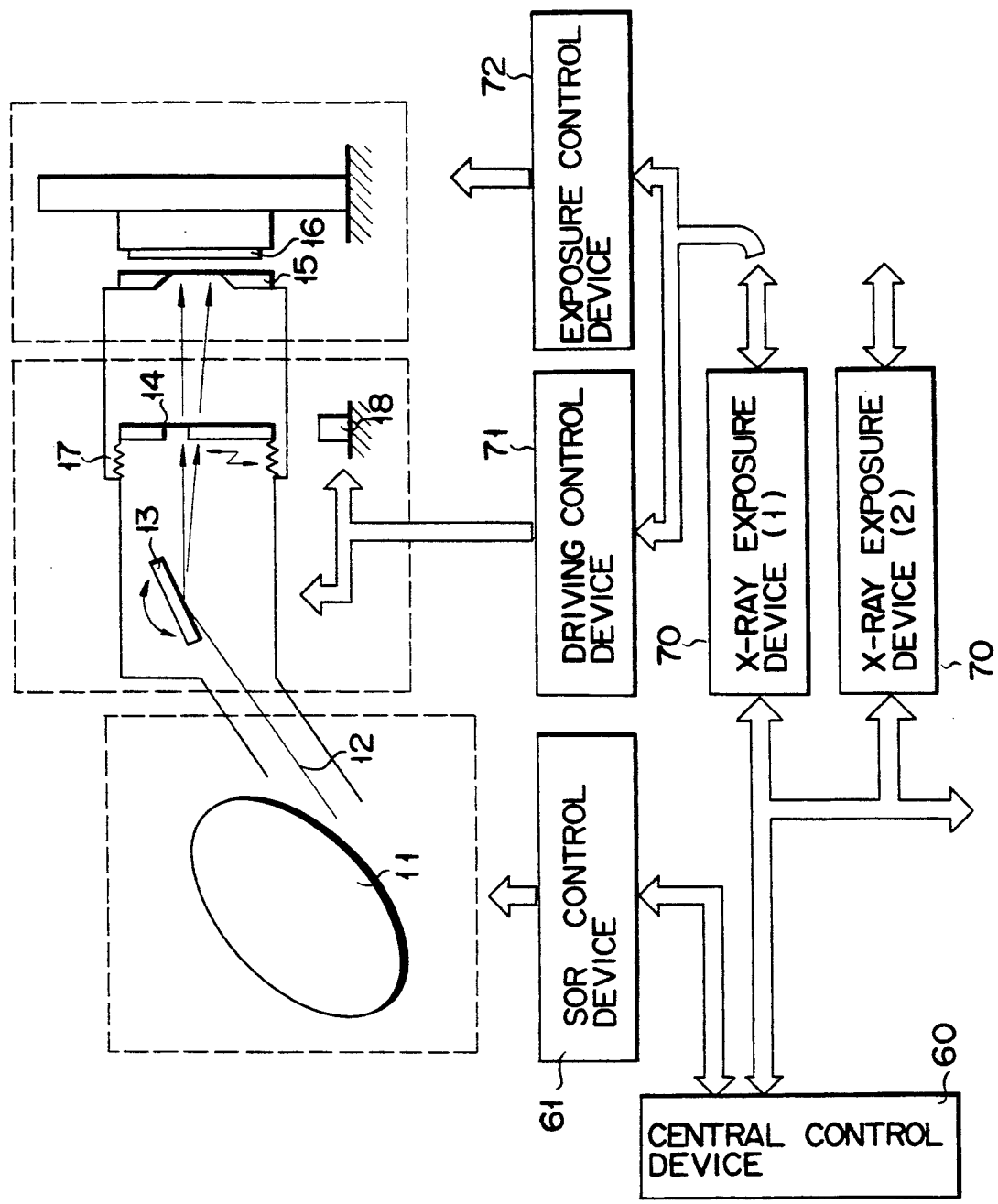
FIG. 8 is a block diagram for a synchrotron radiation apparatus according to the second embodiment of the present invention.

FIG. 8 is a block diagram showing the entire construction of SOR-using facilities in connection with an X-ray lithography apparatus according to the second embodiment of the present invention. In FIG. 8, the same parts as those in FIG. 2 are indicated by the same reference characters and their explanation will be omitted.

Since the SOR is applicable to not only lithography apparatus but also various other applications as described hereinafter and a single SOR can produce a plurality of X-ray beams, this allows a system in which more than one X-ray lithography apparatus is under the control of a central control device 60. Specifically, the central control device 60 controls an SOR control device 61, which then controls the SOR section. In the X-ray lithography apparatus 70, the drivers 18 and 19 in the X-ray beam section are each controlled by a driving control device 71, while the mask holding fixture 31, wafer stage 32 as so on in the exposure section is controlled by the exposure control device 72.

While in the above embodiments, the rectangular window 14 is vertically reciprocated, a disk 51, a portion of which is formed of the beryllium window 14, may be rotated as shown by an arrow mask in FIG. 9A. Placing a magnetic fluid seal 52 on the periphery of the disk 51 assures sufficient mobility and air-tightness of the window 14. In the embodiments, the beryllium window 14 is vertically reciprocated in synchronism with the movement of the X-ray reflecting mirror 13, but they do not necessarily synchronize with each other, and the window 14 may be reciprocated at a period shorter than that for the movement of the mirror 13. In this case, however, the overall X-ray transmitting efficiency decreases because there is a time interval during which some of the X rays are blocked by portions other than the window. If a reduction in the X-ray transmitting efficiency can be tolerated, the disk 51, on the periphery of which a plurality of beryllium windows 14 have been formed in an equal interval for example, may be rotated as shown by an arrow mark in FIG. 9B. In this case, although the X-ray transmitting efficiency decreases, the rotary motion of the beryllium windows 14 can make oscillations due to the motion of the window 14 extremely smaller compared to the reciprocation of the window 14.

Furthermore, in the embodiments, the beryllium window 14 is reciprocated in synchronization with the movement (or the rotary motion) of the X-ray reflecting mirror 13, but changing the angle of the X-ray reflecting mirror 13 according to its parallel movement makes it unnecessary to oscillate the beryllium window 14. In addition, material for the X-ray beam window is not limited to beryllium, but may be other materials that have a high X-ray transmittance and an enough strength to withstand the pressure difference between vacuum and the atmosphere or a depressurized atmosphere.

As described in detail so far, according to this invention, a sufficient X-ray illumination area can be secured without enlarging the X-ray beam window by vertically reciprocating the X-ray beam window in synchronization with the movement of the X-ray reflecting mirror instead of making the X-ray beam window size larger. As a result, it is possible to reduce an attenuation in the X rays at the X-ray beam window and improve the overall exposure throughput.

The above embodiments provide X-ray lithography apparatuses which utilize the radiation (X-rays) from a SOR as the radiation to be radiated to an X-ray region. However, this invention is not limited to the above embodiments, but may be applied to various types of the X-ray microscope.

That is, the present invention may be applied to a tight type X-ray microscope using a method similar to the X-ray lithography, a projection type X-ray microscope for enlarging and projecting on a field of view the X-ray image formed by the X-ray passing through an object, using an optical system such as X-ray reflector, or a scanning type X-ray microscope which focuses X-rays on a point of an object and scans the point for measuring the X-ray transmittance. Particularly, in a case of the scanning type X-ray microscope, since it is desired that the position of the object is not moved during the scanning, the present invention is effective for the scanning type X-ray microscope. FIG. 10 illustrates movement of mirror 13 in which window 14 is stationary, which produces the enlarged field of view on mask 15, as discussed above.

Further, the present invention can be applied to various high intensity type X-ray radiation apparatuses utilizing X-rays, used for medical diagnosis, life science, substance science, material evaluation technique and so on.

Further, the present invention may be applied to a radiation apparatus for optical CVD (chemical vapor deposition) using a free electron laser (having features such as large output, high efficiency, wide band variable range and so on) as the radiation from the SOR, a laser working, a laser accelerator, an atomic power field including an inertia nuclear fusion driver, a tokamak type plasma heating source, an isotope separation and so on, a fundamental atomic/molecule field of research and the like.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A synchrotron radiation apparatus, comprising:
   housing means located adjacent to a synchrotron, for transmitting radiation;
   a radiation reflecting mirror installed in said housing means, for reflecting the radiation generated from said synchrotron;
   mirror driving means for moving said radiation reflecting mirror to enlarge a radiation illumination area illuminated by the radiation;
   radiation beam window means, which is positioned on said synchrotron side within said housing means which houses said radiation reflecting mirror, and, in combination with said housing means, forms a vacuum chamber, and allows the radiation reflected by said radiation reflecting mirror to pass out of said vacuum chamber, the radiation passing through said radiation beam window means being radiated onto an object;
   flexible means for enabling said radiation beam window means to be flexibly installed in said housing means; and
   window driving means for reciprocally moving said radiation beam window means in synchronism with the movement of said radiation reflection mirror,
   wherein said radiation beam window means includes a radiation ray beam window member, a driven member installed in said housing means, on the side of said synchrotron, and driven by said window driving means, and an extension tube connecting said window member and said driven member.

2. A synchrotron radiation apparatus according to claim 1, further comprising an X-ray mask having a pattern, which is installed to said housing means on the side of said object, and onto which X rays contained in the radiation passing through said radiation beam window means are radiated, wherein the X rays passing through the X-ray mask are then radiated onto said object to replicate the pattern of said X-ray mask into said object.

3. A synchrotron radiation apparatus according to claim 2, wherein said housing means includes a first and second chambers separated from each other by said radiation beam window means driven by said window driving means, said first chamber being kept in a high vacuum and housing said radiation mirror, and said second chamber being kept in a substantial atmospheric pressure or a depressurized atmosphere of helium and supporting said mask.

4. A synchrotron radiation apparatus according to claim 3, wherein said radiation beam window means, which includes a beryllium thin film with a reinforced hem, functions as a diaphragm that can withstand the pressure difference between vacuum and the atmosphere.

5. A synchrotron radiation apparatus according to claim 3, wherein said window driving means is placed within the second chamber of said housing means.

6. A synchrotron radiation apparatus according to claim 1, wherein said housing means has a portion between said synchrotron and said radiation beam window which is held in a high vacuum and a portion between said radiation beam window and said X-ray mask being which is held at nearly atmosphere pressure or in a depressurized atmosphere of helium, said radiation beam window is supported by a bearing located in or out the atmosphere between said radiation beam window and said X-ray mask, and said window driving means is located in or out the atmosphere between said radiation beam window and said X-ray mask.

7. A synchrotron radiation apparatus according to claim 1, wherein said driving means includes a driving source and a drive shaft that connects the driving source with said X-ray beam window means.

8. A synchrotron radiation apparatus according to claim 7, wherein said drive shaft is supported by a bearing so as to allow up-and-down motion and is moved up and down by said driving source.

9. A synchrotron radiation apparatus according to claim 1, wherein said radiation beam window means includes one of a rectangular window member and a circular window member.

10. A synchrotron radiation apparatus according to claim 1, wherein said housing means is secured to a support.

11. A synchrotron radiation apparatus according to claim 1, wherein said window driving means, which is placed outside or inside said housing means, includes a bearing that supports said radiation beam window means.

12. A synchrotron radiation apparatus according to claim 1, wherein said window driving means includes means for changing an angle of said mirror according to a parallel movement thereof.

13. A synchrotron radiation apparatus, comprising:
housing means located adjacent to a synchrotron for transmitting radiation;
a radiation reflecting mirror installed in said housing means, for reflecting the radiation generated from said synchrotron;
mirror driving means for moving said radiation reflecting mirror to enlarge a radiation illumination area illuminated by the radiation;
radiation beam window means, which is positioned on said synchrotron side within said housing means which houses said radiation reflecting mirror, and, in combination with said housing means, forms a vacuum chamber and allows the radiation reflected by said radiation reflecting mirror to pass out of said vacuum chamber, the radiation passing through said radiation beam window means being radiated onto an object;
flexible means for enabling said radiation beam window means to be movably installed in said housing means; and
window driving means for reciprocally moving said radiation beam window means in synchronism with the movement of said radiation reflection mirror,
wherein said radiation beam window means includes a rotatable disk and a window member formed on a part of said disk, and said window driving means rotates said disk in a reciprocating manner.

14. A synchrotron radiation apparatus, comprising:
housing means located adjacent to a synchrotron for transmitting radiation;
a radiation reflecting mirror installed in said housing means, for reflecting the radiation generated from said synchrotron;
mirror driving means for moving said radiation reflecting mirror to enlarge a radiation illumination area illuminated by the radiation;
radiation beam window means, which is positioned on said synchrotron side within said housing means which houses said radiation reflecting mirror, and, in combination with said housing means, forms a vacuum chamber and allows the radiation reflected by said radiation reflecting mirror to pass out of said vacuum chamber, the radiation passing through said radiation beam window means being radiated onto an object;
flexible means for enabling said radiation beam window means to be movably installed in said housing means; and
window driving means for reciprocally moving said radiation beam window means in synchronism with the movement of said radiation reflection mirror,
wherein said radiation beam window means includes a rotatable disk and a plurality of window members formed on a periphery of said disk, and said window driving means rotates said disk in a predetermined direction.

15. A synchrotron radiation scanning apparatus, comprising:
a scanning mirror located in a scanning chamber, for scanning synchrotron radiation through reflection in a ultrahigh vacuum;
a radiation beam window, which is perpendicular to the synchrotron radiation axis and movable in the scanning direction;
a linear driving mechanism for driving said X-ray beam window in the scanning direction, in synchronization with a rotation of said scanning mirror;
a beam line which is hermetically connected by a flexible bellows to the scanning chamber and which extends between the beam line and said radiation beam window; and
a mask attached to an end of said movable beam line, wherein vibrations caused by movement of the radiation beam window are substantially prevented from vibrating said mask due to said bellows.

16. A synchrotron radiation apparatus, comprising:
housing means located adjacent to a synchrotron for transmitting radiation;
a radiation reflecting mirror installed in said housing means, for reflecting the radiation generated from said synchrotron;
mirror driving means for moving said radiation reflecting mirror to enlarge a radiation illumination area illuminated by the radiation;
radiation beam window means, which is positioned on said synchrotron side within said housing means which houses said radiation reflecting mirror, and, in combination with said housing means, forms a vacuum chamber, said radiation beam window means allowing the radiation reflected by said radiation reflecting mirror to pass out of said vacuum chamber, and the radiation passing through said radiation beam window means being radiated onto an object;

window driving means for reciprocally moving said radiation beam window means in synchronism with the movement of said radiation reflection mirror, said window driving means comprising a drive shaft coupled to said radiation beam window means, bearing means arranged on said housing and outside said vacuum chamber, for movably supporting said drive shaft in relation to said housing means, and a driving source coupled to said drive shaft, for reciprocally moving said drive shaft; and flexible means for enabling said radiation beam window means to be movably installed in said housing means and sealing said vacuum chamber, said flexible means including first bellows means for movably coupling each of said bearing means and said window driving means with said housing means and second bellows means installed between said radiation beam window means and a working area on which said object is disposed.

17. A synchrotron radiation apparatus according to claim 16, which further includes an X-ray mask having a pattern and arranged on said housing means, on the side of said object so that the X-rays contained in the radiation passing through said radiation beam window means replicates the pattern of said X-ray mask on said object.

18. A synchrotron radiation apparatus according to claim 16, wherein said radiation beam window means includes a beryllium this film having a hem and a reinforce member for reinforcing said hem.

* * * * *